United States Patent
Morin et al.

(10) Patent No.: US 7,187,038 B2
(45) Date of Patent: Mar. 6, 2007

(54) SEMICONDUCTOR DEVICE WITH MOS TRANSISTORS WITH AN ETCH-STOP LAYER HAVING AN IMPROVED RESIDUAL STRESS LEVEL AND METHOD FOR FABRICATING SUCH A SEMICONDUCTOR DEVICE

(75) Inventors: Pierre Morin, Grenoble (FR); Jorge Luis Regolini, Bernin (FR)

(73) Assignee: STMicroelectronics SA, Montrouge (FR)

(*) Notice: Subject to any disclaimer, the term of this patent is extended or adjusted under 35 U.S.C. 154(b) by 0 days.

(21) Appl. No.: 10/701,165

(22) Filed: Nov. 4, 2003

(65) Prior Publication Data
US 2004/0135234 A1 Jul. 15, 2004

(30) Foreign Application Priority Data
Nov. 5, 2002 (FR) .................................. 02 13837

(51) Int. Cl.
*H01L 29/76* (2006.01)
*H01L 23/58* (2006.01)
*H01L 21/00* (2006.01)
*H01L 21/8238* (2006.01)

(52) U.S. Cl. ...................... 257/369; 257/368; 257/638; 257/639; 257/637; 438/153; 438/154; 438/197

(58) Field of Classification Search ................ 438/199, 438/217, 275, 276, 626, 153, 154, 157, 197; 257/369, 371, 197, 351, 638, 639, 637, 368
See application file for complete search history.

(56) References Cited
U.S. PATENT DOCUMENTS

| | | | |
|---|---|---|---|
| 5,332,697 A | 7/1994 | Smith et al. ............... 437/242 |
| 5,795,833 A | 8/1998 | Yu et al. .................... 438/763 |
| 6,146,972 A | 11/2000 | Yamamoto ................. 438/425 |
| 6,165,826 A | 12/2000 | Chau et al. ................ 438/231 |
| 6,228,694 B1 | 5/2001 | Doyle et al. .............. 438/199 |
| 6,372,569 B1* | 4/2002 | Lee et al. .................. 438/229 |
| 6,573,172 B1* | 6/2003 | En et al. .................... 438/626 |
| 6,762,085 B2* | 7/2004 | Zheng et al. .............. 438/199 |
| 2003/0040158 A1* | 2/2003 | Saitoh ....................... 438/279 |

FOREIGN PATENT DOCUMENTS

EP         1168437         1/2002

\* cited by examiner

*Primary Examiner*—Douglas W. Owens
*Assistant Examiner*—Samuel A. Gebremariam
(74) *Attorney, Agent, or Firm*—Lisa K. Jorgenson; Allen, Dyer, Doppelt, Milbrath & Gilchrist, P.A.

(57) ABSTRACT

A semiconductor device includes a substrate, MOS transistors in the substrate, and a dielectric layer on the MOS transistors. Contact holes are formed through the dielectric layer to provide electrical connection to the MOS transistors. An etch-stop layer is between the MOS transistors and the dielectric layer. The etch-stop layer includes a first layer of material having a first residual stress level and covers some of the MOS transistors, and a second layer of material having a second residual stress level and covers all of the MOS transistors. The respective thickness of the first and second layers of material, and the first and second residual stress levels associated therewith are selected to obtain variations in operating parameters of the MOS transistors.

11 Claims, 3 Drawing Sheets

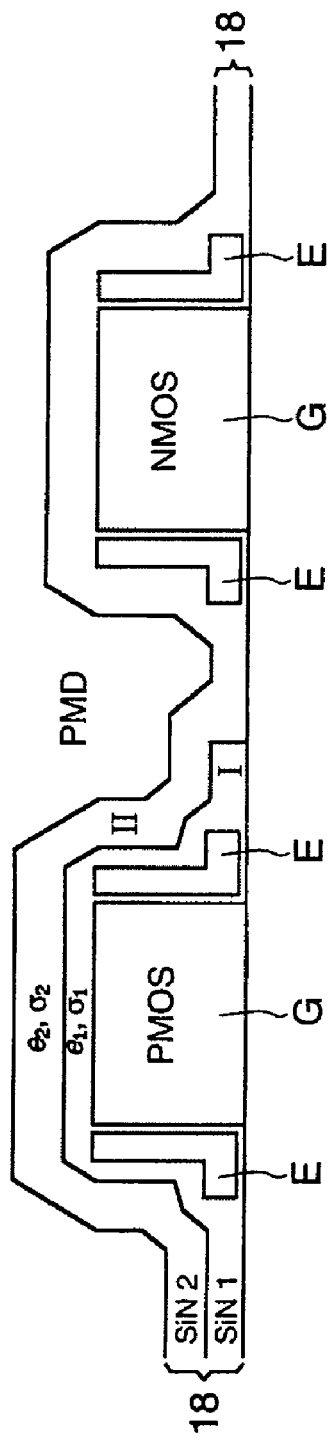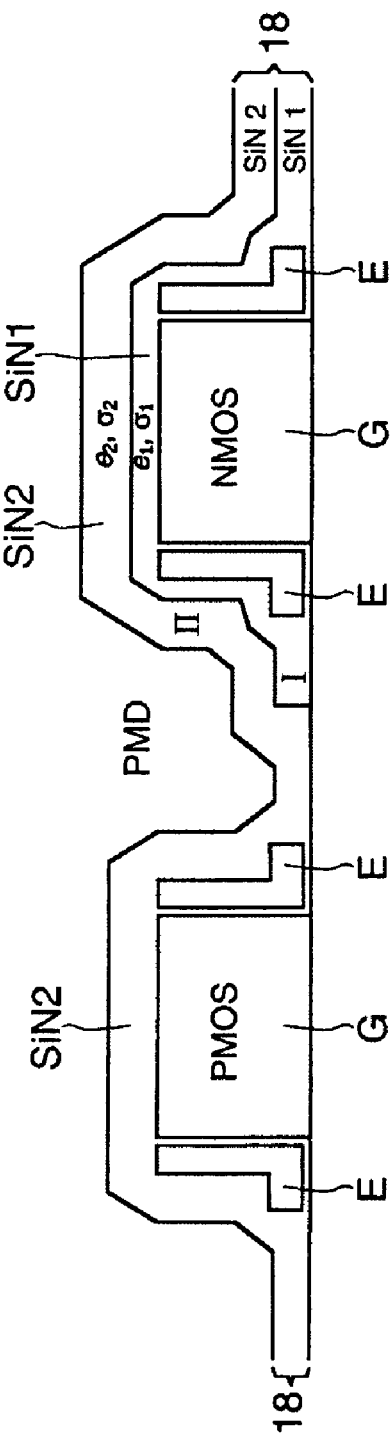

SEMICONDUCTOR DEVICE WITH MOS TRANSISTORS WITH AN ETCH-STOP LAYER HAVING AN IMPROVED RESIDUAL STRESS LEVEL AND METHOD FOR FABRICATING SUCH A SEMICONDUCTOR DEVICE

FIELD OF THE INVENTION

The present invention relates in general to a semiconductor device with MOS transistors.

BACKGROUND OF THE INVENTION

Conventionally, MOS transistors are formed in an active zone of a semiconductor substrate that is isolated from the rest of the substrate by an insulation region. The insulation region may be, for example, a region of the type with shallow trenches (STI: shallow trench isolation). Source and drain regions are formed which delimit a channel between them, and a gate region is formed above the channel. All of this is covered with a dielectric layer in which contact holes are etched for electrical connection of the transistors. An etch-stop layer, for example, a nitride layer without any edges, is between the substrate and the dielectric layer.

Residual stress of the etch-stop layer modifies the performance of the transistor, in particular, the current $I_{ON}$ flowing between the drain and the source in the on-state. This current may be increased or decreased depending on the level of the mechanical constraint applied to the transistors. This is due to the fact that the stop layer induces a local curvature in the substrate of the semiconductor device, which generates a mechanical constraint in the channel. Such a constraint effects the mobility of the carriers, and therefore the performance of the transistor.

By using these properties, the performance of the transistors can be improved by modifying the residual stress level of the stop layer through the implantation of germanium (Ge) in a stop layer that includes nitride. This can be done since the insertion of ions into the nitride destroys the mechanical constraint applied to the silicon.

An etch-stop layer having a negative residual stress level improves the operation of a PMOS transistor but degrades the operation of an NMOS transistor. Conversely, an etch-stop layer having a positive residual stress level improves the operation of NMOS transistors but degrades that of PMOS transistors. Hence, any improvement made to one type of transistor is obtained at the detriment of the other type of transistor. Consequently, ion implantation in the nitride makes it possible either to improve the operation of PMOS transistors or to improve the operation of NMOS transistors, depending on the type of stop layer used.

SUMMARY OF THE INVENTION

In view of the foregoing background, an object of the present invention to provide a semiconductor device having MOS transistors, and a method for fabricating the same, so that the residual stress level of an etch-stop layer is discriminately adapted to the type of transistors that it covers.

This and other objects, advantages and features in accordance with the present invention are provided by a semiconductor device comprising a semiconductor substrate in which MOS transistors are formed therein, a dielectric layer that covers the substrate and in which contact holes are etched, and an etch-stop layer between the substrate and the dielectric layer.

According to a general characteristic of this semiconductor device, the etch-stop layer may include a first layer of material having a first residual stress level and covers some of the transistors, and a second layer of material having a second residual stress level and covers all of the transistors. The thicknesses of the first and second layers, and the first and second residual stress levels may be selected to obtain variations in operating parameters of the transistors with respect to the transistors covered by the first layer of material. By selecting the material of each layer, as well as the thicknesses, it is possible to locally adapt the overall level of residual stress above each type of transistor to improve the performance of the transistors of each type.

According to another characteristic of this device, the MOS transistors may include NMOS transistors and PMOS transistors. The first and second layers of material may have opposite residual stress levels. In this case, the thicknesses of the first layer and of the second layer, and the residual stress levels of the first layer and of the second layer may be determined to obtain a positive stress level above the NMOS transistors and a negative stress level above the PMOS transistors.

For example, the first layer may have a negative stress level and covers the PMOS transistors, and the second layer may have a positive stress level. Alternatively, the first layer may have a positive stress level and covers the NMOS transistors, and the second layer may have a negative stress level.

According to another characteristic of the semiconductor device, the zone of the second layer covering the first layer may have a substantially zero residual stress. The overall level of residual stress of the transistors covered by the first and second layers is thus further improved.

Another aspect of the present invention is directed to a method for fabricating a semiconductor device with MOS transistors as defined above. The method comprises forming the transistors in a semiconductor substrate, depositing an etch-stop layer on the transistors, depositing a dielectric layer on the etch-stop layer and etching connection holes in the dielectric layer.

Depositing the etch-stop layer may comprise the deposition of a first layer of material that has a first residual stress level and covers some of the transistors, and the deposition on the first layer of a second layer of material that has a second residual stress level and covers all of the transistors. The thicknesses of the first and second layers, and the first and second residual stress levels may be selected to obtain variations in operating parameters of the transistors with respect to transistors covered by the first layer of material.

According to one embodiment of the method, depositing the first layer may involve depositing the layer on all of the transistors, depositing a mask on a portion of the transistors, etching the exposed layer and then removing the mask.

According to another characteristic of the method, subsequent to the step of depositing the second layer, a localized treatment of the material of the second layer may be carried out at some of the transistors to locally modify the stress level of the second layer. For example, the treatment of the second layer may be carried out by ion implantation, such as by ion implantation of germanium.

BRIEF DESCRIPTION OF THE DRAWINGS

Other objects, characteristics and advantages of the invention will become apparent on reading the following description, which is provided by way of a non-limiting example and is given with reference to the appended drawings, in which:

FIG. 3 is a sectional view of a semiconductor device according to the present invention;

FIG. 4 illustrates another embodiment of a semiconductor device according to the present invention.

DETAILED DESCRIPTION OF THE PREFERRED EMBODIMENTS

Figure 1:
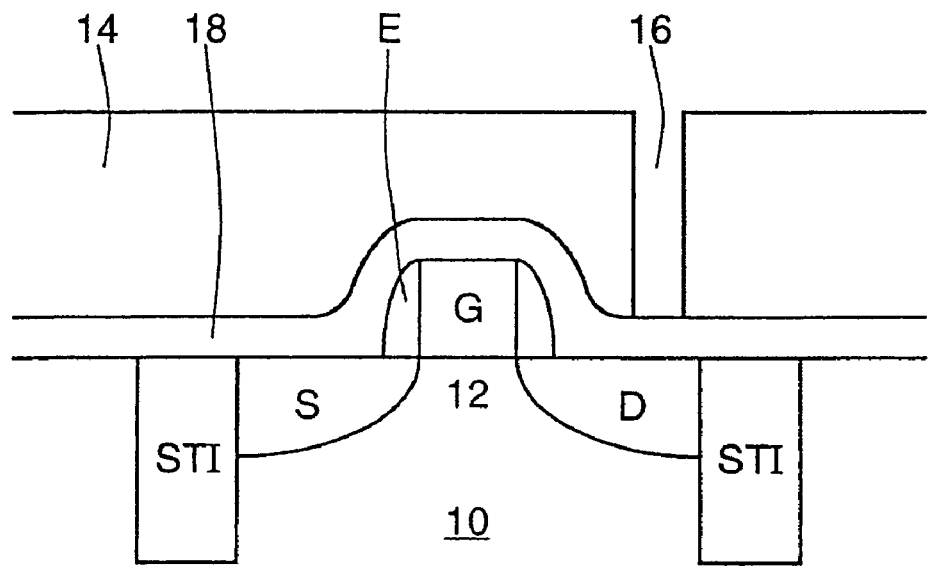
FIG. 1 is a sectional view of a conventional semiconductor device in accordance with the prior art.

FIG. 1 represents the general structure of a conventional semiconductor device with MOS transistors. In the device, only a partial section thereof in which a transistor is formed has been represented in this figure.

This transistor is formed in an active zone (delimited by an insulating region STI) of a semiconductor substrate 10 by forming source regions S and drain regions D which delimit a channel region 12, and by forming a gate G region associated with spacers E so that the gate extends over the channel 12. All of this is covered with a dielectric layer, for example an oxide layer 14, in which connection holes 16 used for electrical connection of the transistors are etched therethrough, with the interposition of an etch-stop layer 18. Only one contact hole, which is used for connecting the drain D of the transistor, has been represented in this FIG. 1 for the sake of clarity.

As indicated above, the layer 18 generates mechanical constraints within the substrate 10, in particular within the region of the substrate 10 forming the channel 12. These constraints lead to a modification of the mobility of the carriers and therefore to a modification (which depends on the residual stress level of the stop layer 18) of the performance of the transistor.

Figure 2:
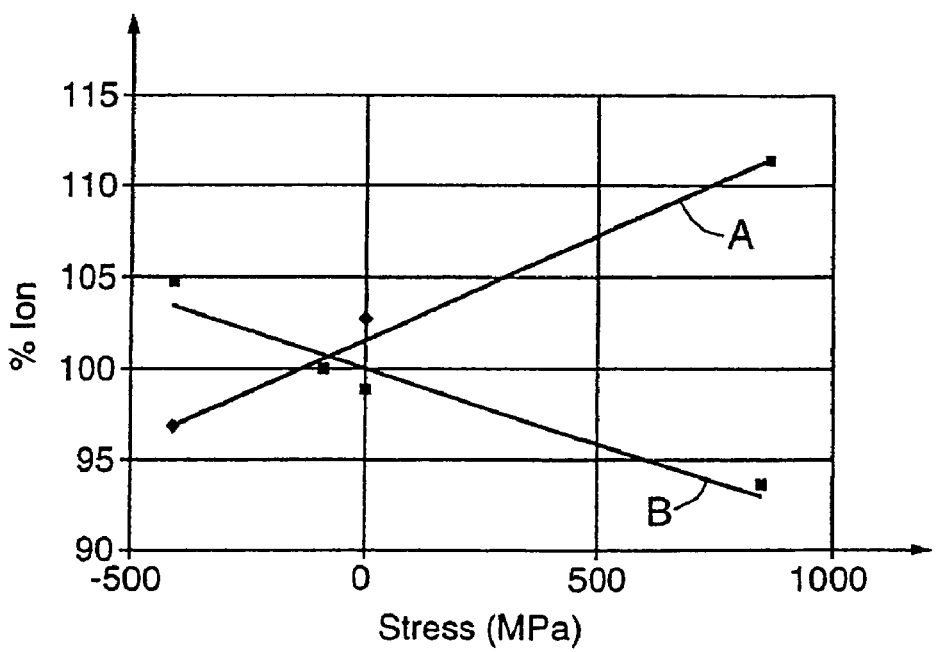
FIG. 2 respectively shows curves illustrating variation in the current $I_{ON}$ of NMOS transistors and PMOS transistors as a function of the residual stress level of the etch-stop layer of the transistor in FIG. 1.

FIG. 2 represents the residual stress level of the stop layer 18 along the x-axis, and represents a percentage variation in the current $I_{ON}$ between the source and the drain of the transistor in the on-state along the y-axis. Moreover, FIG. 2 shows that the use of a stop layer having a positive residual stress level is accompanied by an increase in the current $I_{ON}$, with respect to a material having zero stress, for an NMOS transistor (line A), and by a decrease in the current $I_{ON}$ for a PMOS transistor (line B).

Conversely, the use of a material having a negative stress level is accompanied by a decrease in the current $I_{ON}$ for an NMOS transistor (curve A), and by an increase in the current $I_{ON}$ for a PMOS transistor (curve B).

Increasing the stress leads to an improvement in the performance of an NMOS transistor and a decrease in the performance of a PMOS transistor. Conversely, the use of a material having a negative stress level, i.e., a compressive material, is accompanied by a decrease in the performance of an NMOS transistor and an improvement in the performance of a PMOS transistor. The curves represented in FIG. 2 depend on the architecture and the dimensions of the transistor in question.

FIG. 3 represents the structure of a semiconductor device having a stop layer 18 which makes it possible to obtain good performances with regards to both NMOS transistors and PMOS transistors. Only the transistors and the stop layers have been represented in this figure.

The etch-stop layer 18 includes a first layer I of silicon nitride SiN1 as a stop material that covers some of the transistors, namely the transistors of a first type, and a second layer II of silicon nitride SiN2 covering all of the transistors. In the exemplary embodiment illustrated in FIG. 3, the first layer SiN1 covers the PMOS transistors whereas the layer SiN2 covers the first layer SiN1 as well as the NMOS transistors.

Various techniques may be used for depositing the first and second layers. For example, to deposit the stop layer 18 on the transistors, the first layer SiN1 is deposited on all of the transistors and this layer is etched, so as to leave this layer remaining on only one of the transistor types. The resin layer is then removed and the second layer is deposited on all of the transistors.

The first layer SiN1 has a thickness $e_1$ and a residual stress level $\sigma_1$. The second layer SiN2 has a thickness $e_2$ and a residual stress level $\sigma_2$. The stress levels $\sigma_1$ and $\sigma_2$, as well as the thicknesses $e_1$ and $e_2$, are selected to obtain a negative overall level of residual stress above the PMOS transistors, which can improve the operation of the PMOS transistors.

In this case, specifically, the total stress $\sigma_{tot}$ is determined according to the following formula, on the basis of the total thickness $e_{tot}$ of the stack and the individual stresses and thicknesses of each layer, $\sigma_1$, $e_1$, $\sigma_2$ and $e_2$:

$$\sigma_{tot} \times e_{tot} = \sigma_1 \times e_1 + \sigma_2 \times e_2 \tag{1}$$

In regards to the PMOS transistors, the overall level of stress is given by the following formula:

$$\sigma_{tot} = (\sigma_1 \times e_1 + \sigma_2 \times e_2)/e_{tot} \tag{2}$$

In regards to the NMOS transistors, the stress level is equal to $\sigma_2$. By expediently selecting nitrides having opposite stress levels and by optimizing the thicknesses of each layer, an improvement in the performance is obtained for both types of transistor simultaneously.

As an example, an overall residual stress level $\sigma_{tot}$ of −486 MPa, i.e., a stop layer that can improve the operation of the PMOS transistors, is obtained in the example considered in FIG. 2 by using materials having the following characteristics: $\sigma_1$=−1000 MPa; $e_1$=650 Å; $\sigma_2$=+850 MPa and $e_2$=250 Å.

In the exemplary embodiment illustrated in FIG. 3, the first layer SiN1 covers the PMOS transistors. In one variation, and as shown in FIG. 4, it is also possible to provide a first layer SiN1 that covers the NMOS transistors. In this case, the thicknesses and the residual stresses of the first and second layers SiN1 and SiN2 will be selected to obtain, above the NMOS transistors, a stop layer having a positive residual stress overall.

Figure 5:
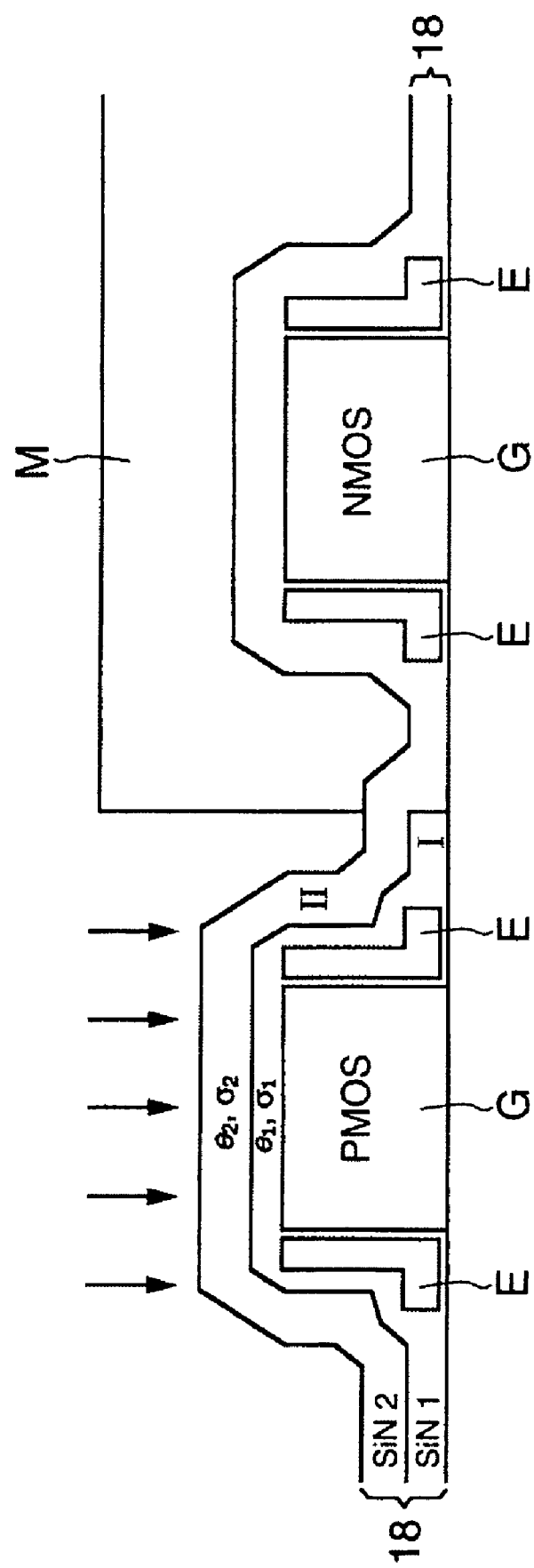
FIG. 5 illustrates a particular embodiment of a method for fabricating a semiconductor device according to the present invention.

Referring now to FIG. 5, and according to another embodiment of the method according to the invention, subsequent to the deposition of the second layer, a localized treatment of the second layer SiN2 is carried out above the first layer. This is done to cancel out the residual stress of the zone of this layer which covers the first layer. To do this, for example, a mask M is formed at the positions of the transistors that are covered only by the second layer, so as to leave exposed those transistors that are covered by the first and second layers. Ion implantation is then carried out, for example by implantation of germanium Ge, to cancel out the residual stress of the upper layer SiN2.

That which is claimed is:

1. A semiconductor device comprising:
   a semiconductor substrate;
   at least one PMOS transistor and at least one NMOS transistor in said semiconductor substrate;
   a dielectric layer on said at least one PMOS transistor and on said at least one NMOS transistor; and
   a first etch-stop layer covering said at least one PMOS transistor and having a first residual stress level; and
   a second etch-stop layer covering said at least one PMOS transistor and said at least one NMOS transistor and having a second residual stress level different than the first residual stress level;
   said first etch-stop layer having a negative residual stress level above said at least one PMOS transistor, and said second etch-stop layer having a positive residual stress level above said at least one NMOS transistor.

2. A semiconductor device according to claim 1, wherein said first and second etch-stop layers have different thicknesses.

3. A semiconductor device according to claim 1, wherein said dielectric layer includes contact openings therethrough for providing electrical connection to said at least one PMOS transistor and to said at least one second MOS transistor.

4. A semiconductor device according to claim 1, wherein a zone formed by said second etch-stop layer overlapping said first etch-stop layer has a substantially zero residual stress level.

5. A method for fabricating a semiconductor device comprising;
   forming at least one PMOS transistor and at least one NMOS transistor in a semiconductor substrate;
   forming a dielectric layer on the at least one PMOS transistor and on the at least one NMOS transistor;
   forming a first etch-stop layer covering the at least one PMOS transistor and having a first residual stress level; and
   forming a second etch-stop layer covering the at least one PMOS transistor and the at least one NMOS transistor and having a second residual stress level different than the first residual stress level;
   the first etch-stop layer having a negative residual stress level above the at least one PMOS transistor, and the second etch-stop layer having a positive residual stress level above the at least one NMOS transistor.

6. A method according to claim 5, wherein the first and second etch-stop layers have different thicknesses.

7. A method according to claim 5, further comprising forming contact openings through the dielectric layer for providing electrical connection to the at least one PMOS transistor and to the at least one NMOS transistor.

8. A method according to claim 5, wherein forming the first etch-stop layer comprises:
   forming the first etch-stop layer covering the at least one NMOS transistor and the at least one transistor;
   forming a mask on the at least one PMOS transistor;
   removing the first etch-stop layer on the at least one NMOS transistor; and
   removing the mask.

9. A method according to claim 5, further comprising performing a localized treatment of the first and second etch-stop layers that overlap the at least one PMOS transistor for modifying the second residual stress level of the second layer.

10. A method according to claim 9, wherein performing the localized treatment comprises implanting ions into the second etch-stop layer.

11. A method according to claim 10, wherein germanium ions are implanted into the second etch-stop layer.

* * * * *

UNITED STATES PATENT AND TRADEMARK OFFICE
CERTIFICATE OF CORRECTION

| | | |
|---|---|---|
| PATENT NO. | : 7,187,038 B2 | Page 1 of 1 |
| APPLICATION NO. | : 10/701165 | |
| DATED | : March 6, 2006 | |
| INVENTOR(S) | : Morin et al. | |

It is certified that error appears in the above-identified patent and that said Letters Patent is hereby corrected as shown below:

Column 6, Line 20    Delete: "NMOS transistor and the at least one transistor;"
                     Insert: --PMOS transistor and the at least one NMOS transistor;--

Signed and Sealed this

Seventh Day of August, 2007

JON W. DUDAS
*Director of the United States Patent and Trademark Office*

UNITED STATES PATENT AND TRADEMARK OFFICE
CERTIFICATE OF CORRECTION

PATENT NO. : 7,187,038 B2  Page 1 of 1
APPLICATION NO. : 10/701165
DATED : March 6, 2007
INVENTOR(S) : Morin et al.

It is certified that error appears in the above-identified patent and that said Letters Patent is hereby corrected as shown below:

Column 6, Line 20   Delete: "NMOS transistor and the at least one transistor;"
                    Insert: --PMOS transistor and the at least one NMOS transistor;--

This certificate supersedes Certificate of Correction issued August 7, 2007.

Signed and Sealed this

Twenty-eighth Day of August, 2007

JON W. DUDAS
*Director of the United States Patent and Trademark Office*